United States Patent
Koga et al.

(10) Patent No.: US 7,248,133 B2
(45) Date of Patent: Jul. 24, 2007

(54) METHOD FOR MANUFACTURING SURFACE ACOUSTIC WAVE DEVICE

(75) Inventors: Wataru Koga, Soraku-gun (JP); Kiyohiro Iioka, Soraku-gun (JP); Mitsutaka Shimada, Kokubu (JP); Shinichiro Kitanishi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 187 days.

(21) Appl. No.: 11/169,292

(22) Filed: Jun. 28, 2005

(65) Prior Publication Data

US 2006/0012450 A1  Jan. 19, 2006

(30) Foreign Application Priority Data

Jun. 28, 2004  (JP)  ............... 2004-190453

(51) Int. Cl.
  *H03H 3/08*  (2006.01)
  *H03H 9/64*  (2006.01)
  *H03H 9/72*  (2006.01)

(52) U.S. Cl. ............ 333/193; 428/108; 428/110; 29/25.35; 264/272.11

(58) Field of Classification Search ............ 333/193; 438/108, 110; 29/25.35; 264/272.11
See application file for complete search history.

(56) References Cited

U.S. PATENT DOCUMENTS 6,670,206 B2* 12/2003 Kim et al. ............... 438/26
7,154,206 B2* 12/2006 Shimada et al. ......... 310/313 R
7,180,228 B2* 2/2007 Masuko et al. ........... 310/348
7,183,124 B2* 2/2007 Onozawa ................. 438/22
2004/0160750 A1 8/2004 Masuko
2004/0169444 A1* 9/2004 Higuchi et al. ........... 310/348

FOREIGN PATENT DOCUMENTS

| JP | 2000-216660 | 8/2000 |
|----|-------------|--------|
| JP | 2002-100945 | 4/2002 |
| JP | 2003-110402 | 4/2003 |
| JP | 2004-072473 | 3/2004 |
| JP | 2004-248039 | 9/2004 |

\* cited by examiner

*Primary Examiner*—Barbara Summons
(74) *Attorney, Agent, or Firm*—Hogan & Hartson LLP

(57) ABSTRACT

A plurality of surface acoustic wave elements, with an IDT electrode 2 and a pad electrode 3 formed on the principal surface of a piezoelectric substrate 1, are formed to be flip-chip mounted on a circuit board 5 and sealed using sealing resin 7. The circuit board 5 is diced integrally with the sealing resin 7 applying a rotating dicing blade 8 from the bottom surface side thereof to produce a plurality of surface acoustic wave devices. The side surfaces of the surface acoustic wave devices can be formed perpendicularly with dimensional accuracy without rounding or chipping an edge portion of the sealing resin 7.

9 Claims, 5 Drawing Sheets

METHOD FOR MANUFACTURING SURFACE ACOUSTIC WAVE DEVICE

BACKGROUND OF THE INVENTION

1. Field of the Invention

The present invention relates to a method for manufacturing a small surface acoustic wave device with a surface acoustic wave element mounted on a circuit board, and more particularly to a method capable of manufacturing a plurality of surface acoustic wave devices stably with a high manufacturing yield at a time. This kind of surface acoustic wave device is used in a radio communication apparatus such as a mobile phone.

2. Description of Related Art

Among mobile radio communication apparatuses, mobile phones have been decreasing in size and weight, and incorporating an increased number of circuit elements to be available in a plurality of communication systems.

Electronic components to be used as such circuit elements are strongly urged to be small-sized ones to improve the mounting density thereof on a main board.

Especially, among circuit elements used in a mobile phone, surface acoustic wave devices as a key device are strongly urged to achieve low-loss and wide-bandwidth characteristics as well as highly attenuated cutoff characteristics outside the passband, and further to decrease in size and height so as to be surface-mounted on a main board.

In addition, surface acoustic wave devices such as surface acoustic wave resonators and surface acoustic wave filters are also widely used in various kinds of radio communication apparatuses, in-car apparatuses, and medical apparatuses that utilize microwave band, which are required to be further reduced in size with the size reduction of such apparatuses.

Therefore, mounting structure types such as face-down surface mounting and CSP (Chip Size Package) are becoming mainstream when mounting surface acoustic wave elements on a circuit board.

The process of manufacturing such surface acoustic wave devices is classified mainly into a "pre-process" in which a surface acoustic wave element is incorporated into a piezoelectric substrate and a "post-process" in which the surface acoustic wave element is mounted on a circuit board.

In a conventional process of manufacturing a surface acoustic wave device of a package mounting type, a plurality of surface acoustic wave elements are incorporated into a piezoelectric substrate in block to be subsequently separated into each component to obtain a plurality of surface acoustic wave element chips (pre-process). Then, each surface acoustic wave element chip is mounted into a package (post-process).

As a result, there are limitations to achieving reductions in size and height, and the conventional process also suffers from a problem that the increased number of man-hours in the post-process leads to a rise in tact and manufacturing cost, resulting in an impact on the product's unit price.

Hence, in order to further reduce the size of surface acoustic wave devices and to simplify the manufacturing process thereof, there has also been proposed a packaging method in which a plurality of surface acoustic wave elements are face-down flip-chip mounted, respectively, in areas to be surface acoustic wave devices on a circuit board, and then the circuit board is finally diced into each surface acoustic wave device in block (refer to Japanese Published Unexamined Patent Application No. 2003-110402, for example).

In this conventional process of manufacturing a surface-mounting type surface acoustic wave device, a plurality of surface acoustic wave elements are mounted on a circuit board to be subsequently separated into each surface acoustic wave device integrally with the circuit board in a dicing process.

In the dicing process, the circuit board is positioned on a base using butting pins, etc., and then diced by inserting a dicing blade between each surface acoustic wave element from the nonfunctioning surface side (opposite the surface of the piezoelectric substrate on which electrodes are formed) of the surface acoustic wave elements covered with sealing resin.

However, in a surface acoustic wave device thus manufactured in accordance with the conventional manufacturing method, since the circuit board on which the surface acoustic wave elements are flip-chip mounted is diced in the dicing process by inserting the dicing blade downward from the sealing resin side, an edge portion of the sealing resin covering the surface acoustic wave device may often be rounded or chipped.

If an edge portion of the sealing resin may be thus rounded or chipped, there occurs a problem that it is difficult to pick up the surface acoustic wave device due to a collet, etc. in the subsequent taping process of the surface acoustic wave device on embossed tape or the mounting process on an electronic circuit module, etc.

In addition, there is no dicing line on the sealing resin side that functions as a dicing guide for dimensionally accurate alignment while dicing the circuit board using the dicing blade from the sealing resin side of the surface acoustic wave device, resulting in poor alignment accuracy in the dicing process.

SUMMARY OF THE INVENTION

Accordingly, it is an object of the present invention to provide a method for manufacturing a dimensionally accurate surface acoustic wave device in a manufacturing process for small surface acoustic wave devices utilizing flip-chip mounting.

The present invention is directed to a method for manufacturing a surface acoustic wave device comprising the steps of: providing a circuit board with a connecting electrode formed thereon for each of a plurality of element mounting areas and the same number of piezoelectric substrates as that of the plurality of element mounting areas; forming an IDT electrode and a pad electrode connected thereto in an area on the principal surface of each piezoelectric substrate corresponding to each element mounting area; mounting a plurality of surface acoustic wave elements on the respective element mounting areas on the circuit board by bonding the pad electrode formed on each piezoelectric substrate to the connecting electrode formed on the upper surface of the circuit board; applying sealing resin to the plurality of surface acoustic wave elements from the surface opposite the principal surface of the piezoelectric substrates over the upper surface of the circuit board; and dicing the circuit board from the bottom surface side thereof to separate the plurality of surface acoustic wave elements into a plurality of surface acoustic wave devices.

In accordance with the method for a manufacturing surface acoustic wave device, the plurality of surface acoustic wave elements are separated from the bottom surface side of the circuit board, which allows the side surfaces of the separated surface acoustic wave devices to be formed perpendicularly without rounding or chipping an edge portion of the sealing resin in the devices.

It is therefore easy to pick up a surface acoustic wave device in the subsequent taping process or the mounting process on an electronic circuit module with no defective mounting, whereby it is possible to manufacture a surface acoustic wave device with a high manufacturing yield in the subsequent processes.

Applying the sealing resin in such a manner that the upper surface thereof is made flat allows a plurality of separated surface acoustic wave devices having a uniform outside dimension to be obtained.

Also, since the sealing resin has a low hardness relative to a circuit board made of material having a high hardness such as ceramic, increasing the thickness of the sealing resin greater than that of the circuit board allows the strength (mechanical resistance) of the sealing resin layer to be equal to that of the circuit board. It is consequently possible to prevent the sealing resin from being chipped in a dicing operation.

Applying a rotating blade from the bottom surface side of the circuit board to separate the plurality of surface acoustic wave elements reduces the possibility of rounding or chipping of an edge portion of the sealing resin in the surface acoustic wave devices.

It is preferred that the feed rate of the blade is set between 3 mm/sec and 10 mm/sec. If the feed rate is slower than the range, the process requires a lot of time, resulting in a reduction in manufacturing efficiency. On the contrary, if the feed rate is higher than the range, the possibility of rounding or chipping of an edge portion of the sealing resin in the surface acoustic wave devices is increased.

It is also preferred that the upper surface of the sealing resin is fixed using tape when separating the plurality of surface acoustic wave elements. Thus fixing using tape allows the circuit board to be fixed to a fixed base, resulting in a smaller relative displacement between the circuit board and the blade during a dicing operation, which can prevent an edge portion of the sealing resin in the surface acoustic wave devices from being chipped.

Also, in the present invention, since the circuit board is diced from the bottom surface side thereof, it is possible to form a dimensionally accurate alignment mark or dicing line on the bottom surface of the circuit board. Since the circuit board can be diced with accuracy using the alignment mark or dicing line as a guide, the dicing accuracy can be improved without accidentally damaging a surface acoustic wave element, resulting in an improvement in manufacturing yield.

Further in the present invention, a laser beam can be applied from the bottom surface side of the circuit board to be diced. Thus dicing using a laser beam in accordance with this method allows a cut section to be formed while selectively forming a modified layer, and also the modified layer to be grown perpendicularly along the cut section. It is therefore possible to perform a high-speed dicing operation with few chippings in the cut section, resulting in an increase in throughput. It is also possible to dice even a thin circuit board stably with accuracy. Furthermore, the accuracy of cut width is improved, and the amount of dust during a dicing operation can be reduced.

The present invention is also directed to a small radio communication apparatus equipped with a surface acoustic wave device that is manufactured in accordance with the method for manufacturing a surface acoustic wave device.

The foregoing and additional advantages, characterizing features and effects of the present invention will become apparent from the following description of embodiments with reference to the accompanying drawings.

DETAILED DESCRIPTION OF PREFERRED EMBODIMENTS

FIGS. 1(a) to 1(e) are cross-sectional views for each step showing a method for manufacturing a surface acoustic wave device according to the present invention.

Figure 2:
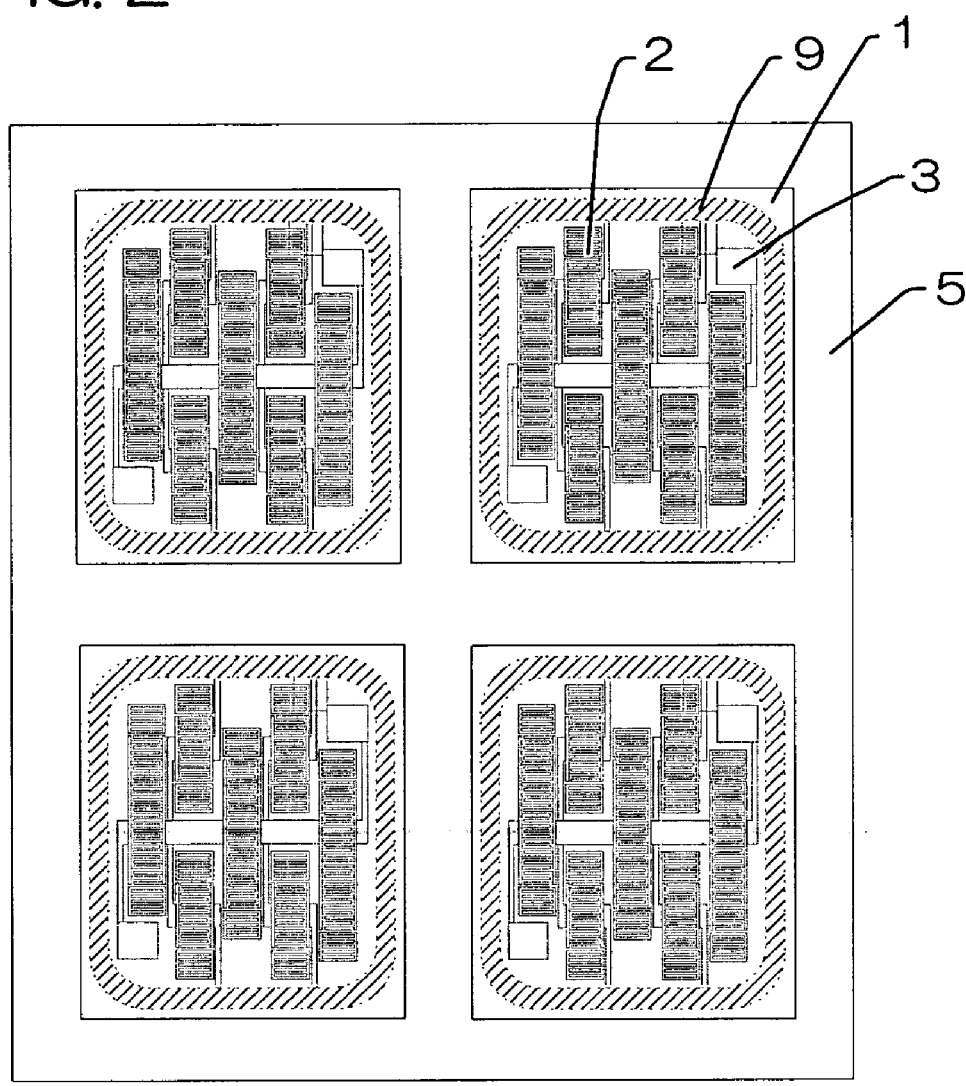
FIG. 2 is a plan view of a circuit board on which surface acoustic wave elements are mounted.

FIG. 2 is a plan view of a circuit board on which surface acoustic wave elements are mounted. Further, FIG. 3 is a plan view of the circuit board as viewed from the bottom surface side thereof.

Figure 1:
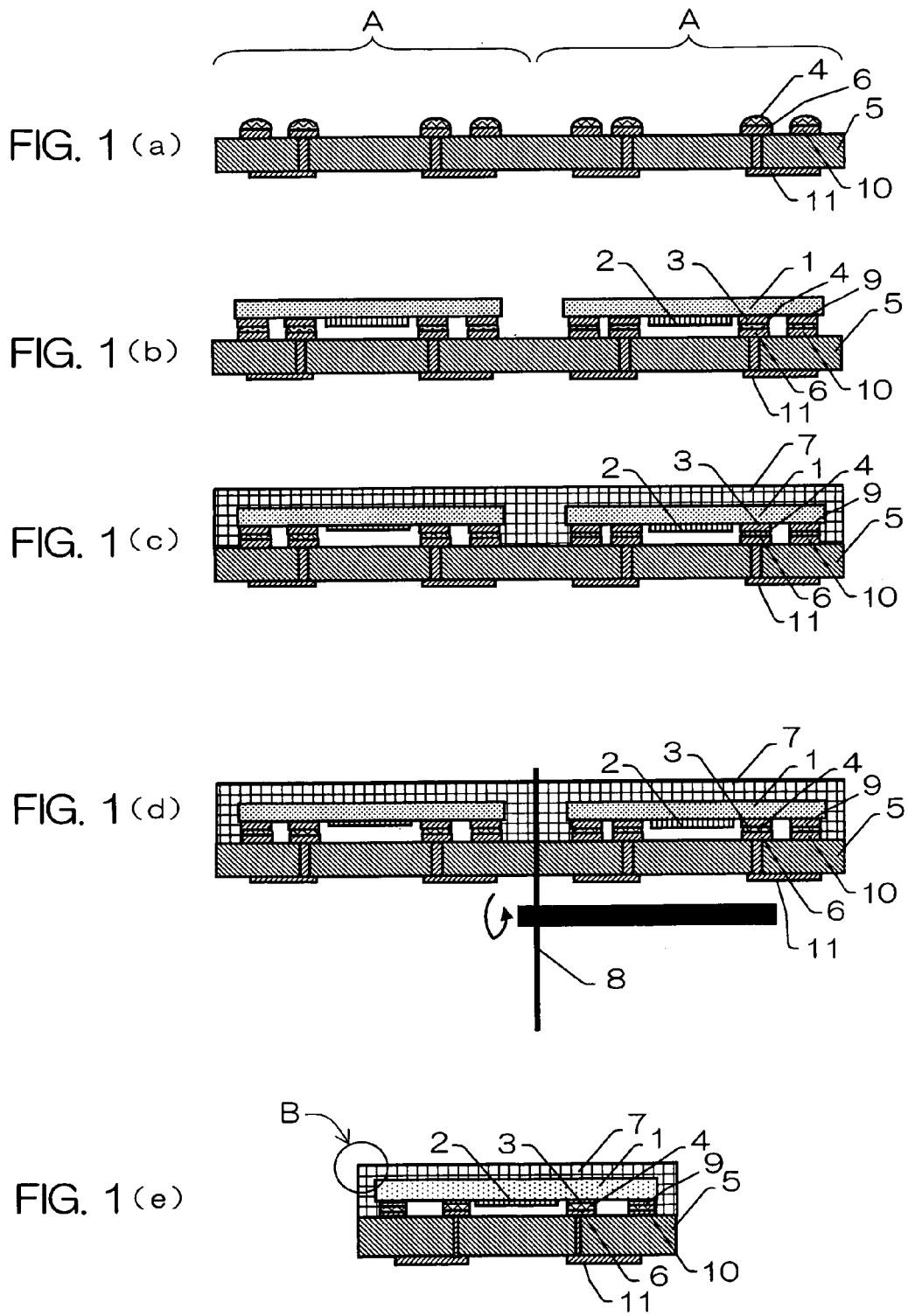
FIGS. 1(a) to 1(e) are cross-sectional views for each step showing a method for manufacturing a surface acoustic wave device according to the present invention.
Figure 3:
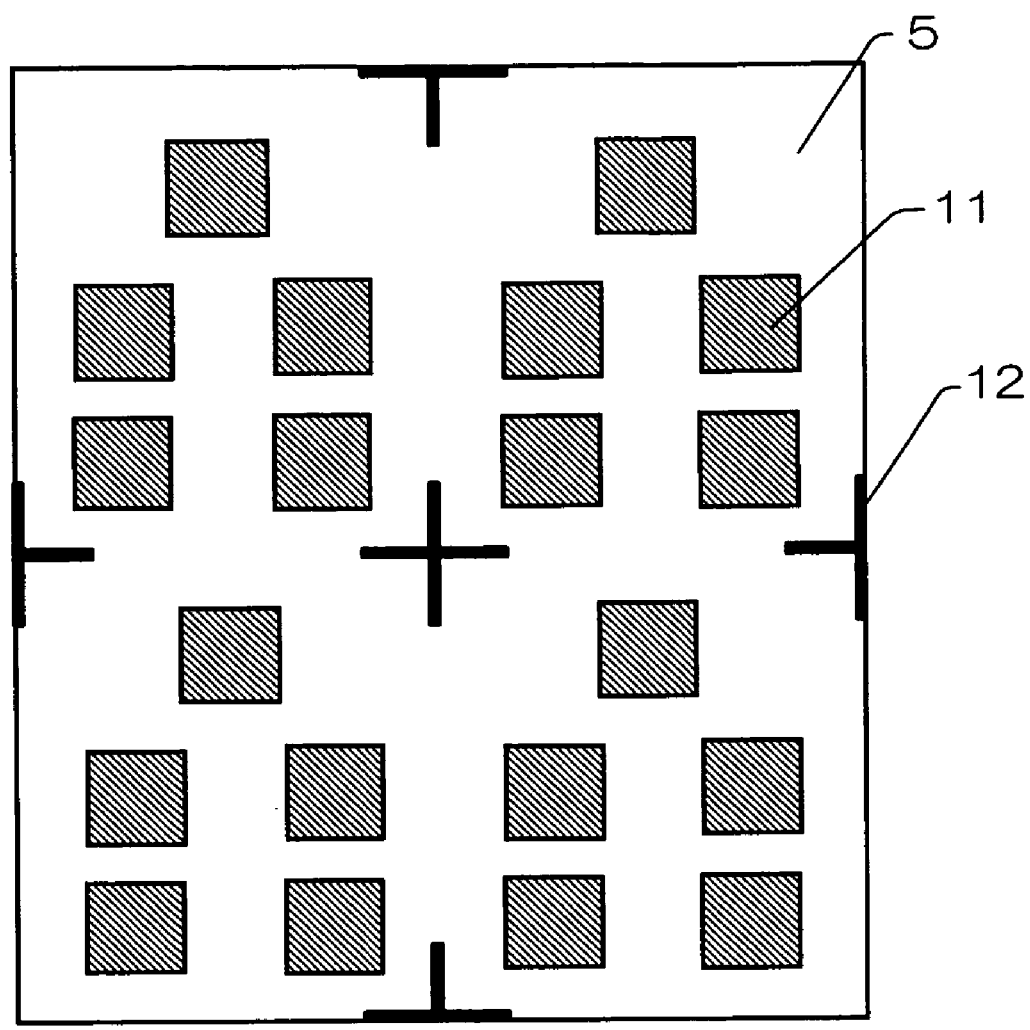
FIG. 3 is a plan view of the circuit board as viewed from the bottom surface side thereof.

In FIGS. 1 to 3, numeral 1 indicates a piezoelectric substrate, numeral 2 indicates an IDT (Inter Digital Transducer) electrode formed on the principal surface of the piezoelectric substrate 1 (the surface on which an IDT electrode 2 is mounted is referred to as "principal surface," i.e. the underside in the example shown in FIG. 1), numeral 3 indicates a pad electrode connected to the IDT electrode 2, numeral 4 indicates a conductor bump, and numeral 5 indicates a circuit board.

It is noted in FIG. 2 that the IDT electrode 2, pad electrode 3, and reflectors, which are formed on the principal surface of each piezoelectric substrate 1, are seen through the substrate from above.

Numeral 6 indicates a connecting electrode formed on the upper surface of the circuit board 5 correspondingly to the pad electrode 3, numeral 7 indicates sealing resin, and numeral 8 indicates a dicing blade for dicing and separating the surface acoustic wave devices.

Also, numeral 9 indicates a circular electrode formed on the principal surface of the piezoelectric substrate 1 in such a manner as to surround the IDT electrode 2 and the pad electrode 3, and numeral 10 a board side circular conductor formed on the upper surface of the circuit board 5 correspondingly to the circular electrode 9.

Numeral 11 indicates an external connection terminal electrode formed on the bottom surface of the circuit board 5, and numeral 12 indicates an alignment mark formed on the bottom surface of the circuit board 5.

The circular electrode 9 is provided in a substantially quadrangular shape along the outer edge portion of the piezoelectric substrate 1, whereby the IDT electrode 2 and the pad electrode 3 can be arranged efficiently within the large area defined by the electrode.

It is preferred that the circular electrode 9 is formed to have a width of, for example, 0.05 mm to 0.15 mm in consideration of the sealing performance by brazing material such as solder and the positioning accuracy.

If the width is below 0.05 mm, it is likely to become difficult to meet the satisfactory sealing performance by solder and the reliability against mechanical stress. On the contrary, if the width of the circular electrode 9 is too large, it becomes difficult to arrange the IDT electrode 2 and the pad electrode 3 efficiently within the large area defined by the electrode. Therefore, it is only required to set the width appropriately in accordance with the characteristics and specifications required for the surface acoustic wave devices.

Next will be described a method for manufacturing such surface acoustic wave devices.

First, a plurality of surface acoustic wave elements will be produced.

A surface acoustic wave element is produced by forming an IDT electrode 2 for generating surface acoustic waves, reflectors (not shown) arranged on both ends of the IDT electrode 2, and a pad electrode 3 connected to the IDT electrode 2 on the principal surface of a piezoelectric substrate 1 that is made of a piezoelectric single crystal such as lithium tantalate single crystal, lithium niobate single crystal, or a lithium tetraborate single crystal. Also, the IDT electrode 2, reflectors, and pad electrode 3 are covered, if necessary, with a protective film (not shown) that is made of silicon oxide, etc. On the principal surface of the piezoelectric substrate 1 is further formed a circular electrode 9 for airtight sealing in such a manner as to surround the IDT electrode 2 and the pad electrode 3.

The IDT electrode 2 is produced by providing at least a pair of comb-teeth-shaped electrodes formed in such a manner as to engage with each other. In order to obtain desired characteristics, multiple pairs of IDT electrodes 2 may also be connected in series or parallel.

The surface acoustic wave elements constitute a ladder-type surface acoustic wave filter, double-mode surface acoustic wave resonator filter, etc.

The IDT electrode 2, reflectors, pad electrode 3, and circular electrode 9 are formed as follows.

First, Al alloy, etc., is used to form a thin film by thin film formation method such as the sputtering method, deposition method, or CVD (Chemical Vapor Deposition) method. Next, a reduction projection aligner (stepper) and an RIE (Reactive Ion Etching) apparatus are used to perform patterning by photolithographic method, etc.

Then, a protective film for covering these electrodes is formed by thin film formation method such as the CVD method or deposition method. Such a protective film can employ a silicon oxide film, silicon nitride film, or silicon film, etc. formed by thin film formation method such as the CVD method or deposition method.

The protective film is then partially removed by photolithographic method to expose the pad electrode 3.

Meanwhile, the circuit board 5 is produced, for example, from a single ceramic substrate or by laminating a ceramic substrate and at least a single ceramic frame body.

Next, a connecting electrode 6 corresponding to the pad electrode 3 of each surface acoustic wave element is formed for each element mounting area A, on which a plurality of surface acoustic wave elements are mounted, on the upper surface of the circuit board 5 as shown in FIG. 1(a). The connecting electrode 6 is formed by any method selected from a printing method (such as screen printing), an electrolytic plating method or a non-electrolytic plating method, or the like.

If a circular electrode 9 is formed on the principal surface of the piezoelectric substrate 1 of each surface acoustic wave element, a board side circular conductor 10 is to be formed correspondingly to the circular electrode 9.

Next, a conductor bump 4 is formed on the pad electrode 3 of the piezoelectric substrate 1 or on the connecting electrode 6 of the circuit board 5. In the example shown in FIG. 1(a), a conductor bump 4 is formed on the connecting electrode 6 of the circuit board 5.

Forming or applying, for example, solder paste or gold-tin paste by a printing method such as screen printing or by means of a dispenser can provide a plurality of conductor bumps 4 simultaneously.

Also, in the example shown in FIG. 1, an external connection terminal electrode 11 to be connected to the connecting electrode 6 via a through conductor is formed on the bottom surface of the circuit board 5. The external connection terminal electrode 11 functions as an electrode for surface mounting when mounting the surface acoustic wave device on an electronic circuit module, etc.

Next, in each of the plurality of surface acoustic wave elements thus arranged, the pad electrode 3 on one principal surface of the piezoelectric substrate 1 and the connecting electrode 6 on the upper surface of the circuit board 5 are connected through each conductor bump 4 so that the principal surface of the piezoelectric substrate 1, on which the IDT electrode 2 is provided, faces the upper surface of the circuit board 5 as shown in FIG. 1(b) (referred to as face-down mounting).

Then, the circuit board 5 with the piezoelectric substrate 1 disposed thereon is subject to reflow fusing in a reflow furnace, whereby the conductor bump 4 is fused to bond the pad electrode 3 solidly to the connecting electrode 6. Thus, a plurality of surface acoustic wave elements can be mounted on a single circuit board 5.

At the same time, the circular electrode 9 formed on the principal surface of the piezoelectric substrate 1 in such a manner as to surround the IDT electrode 2 and the pad electrode 3 and the board side circular conductor 10 formed on the upper surface of the circuit board 5 correspondingly to the circular electrode 9 in such a manner as to surround the connecting electrode 6 are bonded using the same bonding conductor as for the conductor bump 4, e.g. brazing material such as solder, so that the IDT electrode 2, the pad electrode 3, and the connecting electrode 6 connected to the pad electrode 3 through the conductor bump 4 are sealed within the space surrounded by the circular electrode 9 and the board side circular conductor 10.

The bonding of the circular electrode 9 and the board side circular conductor 10 in such a manner as to circularly seal the inside space thereof allows the airtightness of the surface acoustic wave element on the functioning surface side to be maintained. In addition, even if a force may be applied to the piezoelectric substrate 1 in a dicing operation to be described hereinafter, the force is received by the circular electrode 9 and the board side circular conductor 10 to protect the IDT electrode 2, the pad electrode 3, the conductor bump 4, and the connecting electrode 6 internally provided. Therefore, the surface acoustic wave element can be operated stably without being affected by a dicing operation, and can be operated over a long period of time, to achieve a highly reliable surface acoustic wave device.

The inside space circularly sealed by the circular electrode 9 and the board side circular conductor 10 may be provided with low-humidity air and sealed. Inert gas such as nitrogen gas or argon gas may also be provided instead of air.

Next, as shown in FIG. 1(c), sealing resin 7 is applied in such a manner as to cover the piezoelectric substrate 1 from the upper surface (the other principal surface) of the piezoelectric substrate 1 over the upper surface of the circuit board 5 to seal each of the plurality of surface acoustic wave elements.

At this time, it is preferred that the sealing resin 7 is applied to the entire circuit board 5 in such a manner that the upper surface of the sealing resin 7 covering each piezoelectric substrate 1 is made flat. This allows a plurality of separated surface acoustic wave devices having a uniform outside dimension to be obtained.

The sealing resin 7 can employ, for example, epoxy resin, biphenyl resin, polyimide resin, or resin with filler such as alumina, aluminum nitride, or silicon nitride mixed thereto as a solid content.

The covering and sealing of the piezoelectric substrate 1 with the sealing resin 7 allows the piezoelectric substrate 1 as well as electrical connection parts between the surface acoustic wave element and the circuit board 5 to be protected, and therefore the piezoelectric substrate 1 and the electrical connection parts to be protected from mechanical impact, moisture, chemicals, etc., whereby a highly reliable surface acoustic wave device can be achieved.

In the sealing process above, the sealing resin 7 is applied to the upper surface of the circuit board 5 by a potting method or a printing method, etc. in such a manner as to cover each piezoelectric substrate 1. Heating and hardening of the sealing resin 7 allows reliably stable sealing.

Then, as shown in FIG. 1(d), the upper surface of the sealing resin 7 is fixed to a fixed base using tape 13 (refer to FIG. 4), and a dicing blade 8 is positioned in such a manner that the upper end of the dicing blade 8 reaches the upper surface of the sealing resin 7. The rotation axis of the dicing blade 8 is here positioned below the circuit board 5. It is noted that although the rotation axis of the dicing blade 8 is positioned below the circuit board 5 in FIG. 1(d), if the overall configuration is turned upside down, the rotation axis of the dicing blade 8 is positioned over the circuit board 5, where a dicing operation may be performed.

It is also desired that the thickness of the sealing resin 7 is greater than that of the circuit board 5. This compensates for the strength of the sealing resin 7, which is lower than that of the circuit board 5, which can prevent the occurrence of chipping when the dicing blade 8 cuts into the sealing resin 7.

Such a dicing blade 8 to be used in a dicing operation can employ, for example, resin or electrodeposition Ni base material with diamond grain distributed thereacross.

While rotating the dicing blade 8 at a predetermined rotation speed and feeding the circuit board 5, dicing operation is performed upward from the bottom surface side (the underside in the example shown in FIG. 1) of the circuit board 5 to separate the element mounting areas A with each piezoelectric substrate 1 mounted thereon into each surface acoustic wave device. Thus, a plurality of surface acoustic wave devices shown in FIG. 1(e) can be obtained.

The dicing blade 8 is used for the dicing operation in the example shown in FIG. 1(d). This dicing operation allows a cutting article to be diced while being cooled by cooling water, which can reduce heat generation in the surface acoustic wave element and therefore prevent pyroelectric breakdown of the IDT electrode 2 due to heat generation in the dicing operation.

The circuit board 5 can be diced also by laser processing from the bottom surface side thereof. The dicing using a laser beam in accordance with this method allows a cut section to be formed while selectively forming a modified layer, and also the modified layer to be grown perpendicularly along the cut section, whereby it is possible to perform a high-speed dicing operation with few chippings in the cut section, resulting in an increase in throughput. It is also possible to dice even a thin circuit board 5 stably with accuracy. Furthermore, the accuracy of the cut width is improved, and the amount of dust during a dicing operation can be reduced.

Also, since the sealing resin 7 side is fixed using tape, the blurring of the dicing blade 8 during a dicing operation can be reduced.

When performing a dicing operation from the bottom surface side of the circuit board 5 integrally with the sealing resin 7 to separate the surface acoustic wave elements into each element mounting area A as described in the present embodiment, since an alignment mark 12 is formed on the bottom surface side of the circuit board 5 as shown in FIG. 3, the circuit board 5 can be diced with accuracy using the alignment mark 12 as a guide. Therefore, the alignment accuracy is improved not to damage a surface acoustic wave element in a dicing operation, resulting in an improvement in manufacturing yield.

The surface acoustic wave device thus produced is obtained by dicing the circuit board 5 integrally with the sealing resin 7 from the bottom surface side of the circuit board 5 in the step of separating into each surface acoustic wave device, which allows the possibility of rounding or chipping of an edge portion (e.g. indicated by the arrow B) of the sealing resin 7 in the surface acoustic wave device to be reduced as shown in the cross-sectional view of FIG. 1(e), and the side surfaces of the sealing resin 7 and the circuit board 5 to be formed perpendicularly. It is therefore possible to achieve a dimensionally accurate surface acoustic wave device reliably.

This improves the manufacturing yield in a dicing process, and further can provide dimensionally accurate surface acoustic wave devices with handling stability and an improved manufacturing yield in the subsequent processes at a high productivity.

Here, the present invention is not restricted to the above-mentioned embodiment and various modifications can be made thereto without departing from the gist of the present invention.

For example, although the above-mentioned embodiment is exemplified in the case where the circular electrode 9 for airtight sealing is formed along the outer edge portion of the piezoelectric substrate 1, no circular electrode 9 may be formed.

It may also be arranged that the IDT electrode 2 of each surface acoustic wave element is covered with a cover body, etc. fixed to the piezoelectric substrate 1 against the circuit board 5. Also, in this case, separated surface acoustic wave devices have a high airtightness and are reduced in size due to the flip-chip mounting structure without rounding or chipping an edge portion of the sealing resin 7 thereon, and the side surfaces of the surface acoustic wave devices including edge portions of the sealing resin 7 can be formed perpendicularly.

EXAMPLE 1

Figure 4:
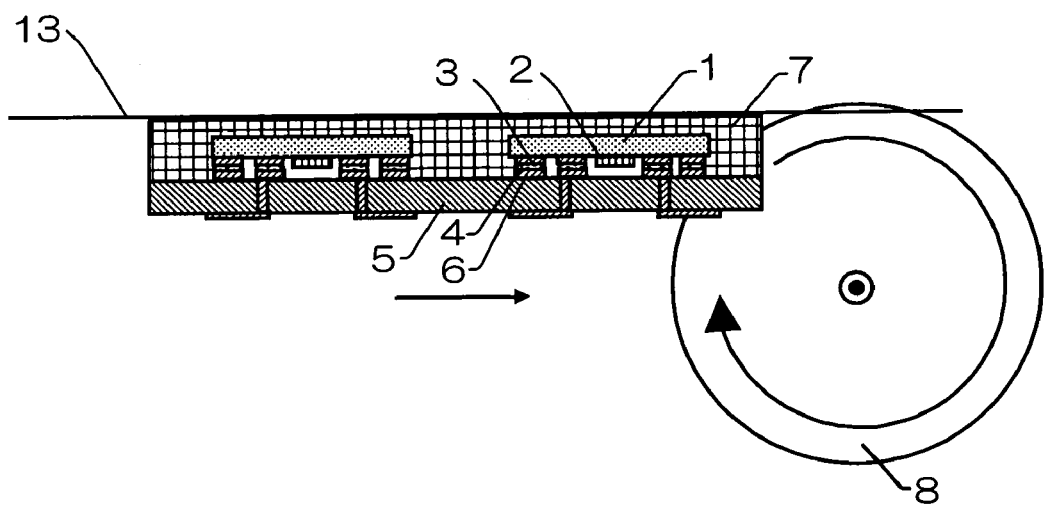
FIG. 4 is a cross-sectional view showing a state where the circuit board is diced from the bottom surface side thereof to obtain a plurality of surface acoustic wave devices.

As shown in FIG. 4, the sealing resin side in a plurality of surface acoustic wave devices that are formed on the circuit board 5 is fixed using tape 13, and the dicing blade 8 is applied from the circuit board side to perform a dicing operation. The rotation axis of the dicing blade 8 is positioned below the circuit board 5.

Figure 5:
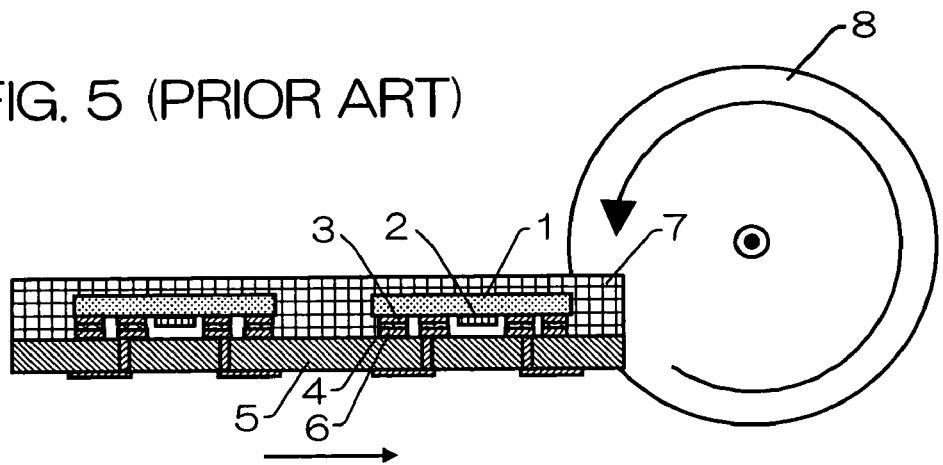
FIG. 5 is a cross-sectional view showing a state where the circuit board is diced from the upper surface side thereof to obtain a plurality of surface acoustic wave devices.

Further as a comparative example, the surface acoustic wave devices are separated from the sealing resin 7 side as shown in FIG. 5. In this case, the rotation axis of the dicing blade 8 is positioned over the circuit board 5.

The feed rate is set in seven steps of 1 mm/sec to 15 mm/sec (refer to Table 1). The water flow rate during the dicing operation is set to 1 liter/min, the rotation speed of the blade to 30,000 rpm, and the cutting depth of the tape to 30 µm.

The number of separated surface acoustic wave devices is 100 for each feed rate.

The existence of chipping in an edge portion of the sealing resin is determined using the distance D from the edge.

Figure 6:
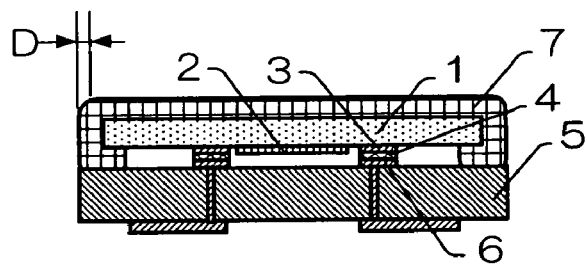
FIG. 6 is a cross-sectional view illustrating the chip width D from an edge portion of the sealing resin.

The distance D is specifically shown in FIG. 6. If the distance D is 60 µm or more, the surface acoustic wave device is determined to have a chipping defect and classified as defective.

The non-defective rate (%) of separated surface acoustic wave devices having no chipping defect was calculated for each feed rate as shown in Table 1.

TABLE 1

| Feed rate of dicing | Chipping defect yield (%) | |
|---|---|---|
| blade (mm/sec) | Example | Comparative example |
| 1.0 | 99.9 | 97.0 |
| 3.0 | 99.8 * | 95.3 |
| 5.0 | 99.8 * | 94.1 |
| 7.0 | 99.6 * | 92.9 |
| 10.0 | 99.0 * | 91.2 |
| 13.0 | 88.3 | 82.4 |
| 15.0 | 72.7 | 63.1 |

* Optimal ranges

As shown in Table 1, if the surface acoustic wave devices are separated from the circuit board 5 side, fixing the upper surface of the sealing resin 7 using dicing tape and dicing at a feed rate of 1 mm/sec to 10 mm/sec can ensure a non-defective rate of 99% or more. The non-defective rate is reduced at a feed rate of 13 mm/sec or more.

However, the feed rate of 1 mm/sec is too low to finish the dicing operation in a shorter time.

Hence, the feed rate between 3 mm/sec and 10 mm/sec is determined to be optimal.

Meanwhile, in the case of the comparative example where the surface acoustic wave devices are separated from the sealing resin 7 side, the non-defective rate at a feed rate of 1 mm/sec is 97%, and the higher the feed rate, the lower the non-defective rate due to an increase in the number of devices having a chipping defect.

It is therefore found that by separating surface acoustic wave devices from the circuit board 5 side as disclosed in the present invention, a high non-defective rate is achieved and the non-defective rate is not reduced even if the feed rate is increased.

According to the present invention, the production yield can be improved and the speed of the manufacturing process can be increased relative to the prior art.

EXAMPLE 2

Next, from 100 samples of the surface acoustic wave devices separated at a feed rate of 3 mm/sec in the above-mentioned example and the comparative example, 15 samples are extracted at random.

Figure 7:
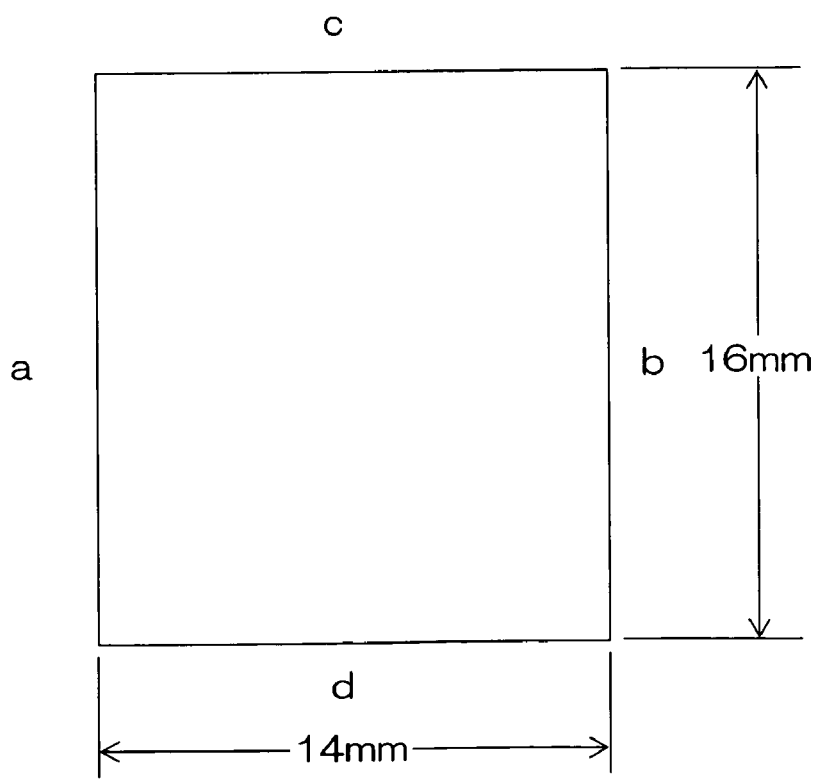
FIG. 7 is a plan view showing dimensions of the sides of a separated surface acoustic wave device.

The planar shape of the samples is rectangular as shown in FIG. 7. The surface acoustic wave device is separated by cutting the four sides thereof in the order of "a," "b," "c," and "d." After cutting the side "a," the surface acoustic wave device is moved in parallel to cut the side "b," moved in a rotational manner to cut the side "c," and then moved in parallel to cut the side "d." The chipping value of the sides "c" and "d" is slightly high. This is for the reason that when cutting the sides "c" and "d," the dicing blade 8 is brought into contact with the end portions of the sides "a" and "b" that have already been cut.

The chip width D (µm) from the edge was measured for each side of "a," "b," "c," and "d" of the respective surface acoustic wave devices.

The measured values of the chip width D are shown in Tables 2 and 3. Table 2 includes values for the example, while Table 3 for the comparative example.

TABLE 2

Example

| | | | | Unit: µm |
|---|---|---|---|---|
| Sample No. | a | b | c | d |
| 1 | 10.0 | 40.0 | 30.0 | 20.0 |
| 2 | 20.0 | 20.0 | 30.0 | 40.0 |
| 3 | 40.0 | 10.0 | 20.0 | 30.0 |
| 4 | 30.0 | 10.0 | 30.0 | 30.0 |
| 5 | 30.0 | 20.0 | 10.0 | 20.0 |
| 6 | 10.0 | 10.0 | 30.0 | 20.0 |
| 7 | 30.0 | 20.0 | 20.0 | 40.0 |
| 8 | 30.0 | 40.0 | 20.0 | 40.0 |
| 9 | 30.0 | 30.0 | 30.0 | 10.0 |
| 10 | 20.0 | 10.0 | 40.0 | 30.0 |
| 11 | 10.0 | 30.0 | 20.0 | 40.0 |
| 12 | 20.0 | 20.0 | 20.0 | 20.0 |
| 13 | 20.0 | 20.0 | 40.0 | 20.0 |
| 14 | 30.0 | 40.0 | 30.0 | 20.0 |
| 15 | 10.0 | 10.0 | 30.0 | 10.0 |
| Average | 22.7 | 22.0 | 26.7 | 26.0 |
| Chipping defect yield (%) | 100.0 | 100.0 | 100.0 | 100.0 |
| Total chipping defect yield (%) | 100.0 | | | |

TABLE 3

Comparative Example

| | | | | Unit: µm |
|---|---|---|---|---|
| Sample No. | a | b | c | d |
| 1 | 40.0 | 40.0 | 50.0 | 50.0 |
| 2 | 60.0 | 40.0 | 50.0 | 40.0 |
| 3 | 50.0 | 30.0 | 50.0 | 40.0 |
| 4 | 30.0 | 50.0 | 40.0 | 40.0 |
| 5 | 40.0 | 40.0 | 50.0 | 50.0 |
| 6 | 30.0 | 40.0 | 50.0 | 50.0 |
| 7 | 30.0 | 50.0 | 50.0 | 50.0 |
| 8 | 40.0 | 40.0 | 40.0 | 50.0 |
| 9 | 40.0 | 40.0 | 50.0 | 50.0 |
| 10 | 50.0 | 50.0 | 50.0 | 40.0 |
| 11 | 50.0 | 30.0 | 40.0 | 40.0 |
| 12 | 50.0 | 40.0 | 50.0 | 50.0 |
| 13 | 40.0 | 50.0 | 40.0 | 40.0 |
| 14 | 50.0 | 40.0 | 40.0 | 50.0 |
| 15 | 40.0 | 50.0 | 50.0 | 50.0 |
| Average | 42.7 | 42.0 | 46.7 | 46.0 |
| Chipping defect yield (%) | 93.3 | 100.0 | 100.0 | 100.0 |
| Total chipping defect yield (%) | 93.3 | | | |

It is found from Table 2 that the average chipping width in the example is 20 µm to 30 µm, and that there is no sample having a chipping width of 60 µm (chipping defect reference value) or more. It is found from Table 3 that the average chipping width is 40 µm to 50 µm, which is higher than that in the example. There is also one sample having a chipping width of 60 µm (chipping defect reference value) or more.

It is found from the foregoing results that the example where the devices are separated from the circuit board 5 side shows a small chipping width wholly relative to the comparative example where the devices are separated from the sealing resin 7 side as disclosed in the prior art.

The invention claimed is:

1. A method for manufacturing a surface acoustic wave device comprising the steps of:
   (a) providing a circuit board with a connecting electrode formed thereon for each of a plurality of element mounting areas and the same number of piezoelectric substrates as that of the plurality of element mounting areas;
   (b) forming an IDT electrode and a pad electrode connected thereto in an area on the principal surface of each piezoelectric substrate corresponding to each element mounting area;
   (c) mounting a plurality of surface acoustic wave elements on the respective element mounting areas on the circuit board by bonding the pad electrode formed on each piezoelectric substrate to the connecting electrode formed on the upper surface of the circuit board;
   (d) applying sealing resin to the plurality of surface acoustic wave elements from the surface opposite the principal surface of the piezoelectric substrates over the upper surface of the circuit board; and
   (e) dicing the circuit board from the bottom surface side thereof to separate the plurality of surface acoustic wave elements into a plurality of surface acoustic wave devices.

2. The method for manufacturing a surface acoustic wave device according to claim 1, wherein the sealing resin is applied in such a manner that the upper surface thereof is made flat in step (d).

3. The method for manufacturing a surface acoustic wave device according to claim 2, wherein the thickness of the sealing resin in the manufactured surface acoustic wave devices is greater than that of the circuit board.

4. The method for manufacturing a surface acoustic wave device according to claim 1, wherein a rotating blade is applied from the bottom surface side of the circuit board to separate the plurality of surface acoustic wave elements in the step (e).

5. The method for manufacturing a surface acoustic wave device according to claim 4, wherein the feed rate of the blade is set between 3 mm/sec and 10 mm/sec.

6. The method for manufacturing a surface acoustic wave device according to claim 4, wherein the upper surface of the sealing resin is fixed using tape when separating the plurality of surface acoustic wave elements in step (e).

7. The method for manufacturing a surface acoustic wave device according to claim 4, wherein the circuit board is diced along a dicing line for alignment provided on the bottom surface of the circuit board in step (e).

8. The method for manufacturing a surface acoustic wave device according to claim 1, wherein a laser beam is applied from the bottom surface side of the circuit board to separate the plurality of surface acoustic wave elements in step (e).

9. A radio communication apparatus equipped with a surface acoustic wave device that is manufactured in accordance with the method for manufacturing a surface acoustic wave device according to claim 1.

* * * * *